United States Patent
Ahmed et al.

(10) Patent No.: US 9,899,324 B1
(45) Date of Patent: Feb. 20, 2018

(54) STRUCTURE AND METHOD OF CONDUCTIVE BUS BAR FOR RESISTIVE SEED SUBSTRATE PLATING

(71) Applicant: GLOBALFOUNDRIES Inc., Grand Cayman (KY)

(72) Inventors: Shafaat Ahmed, Ballston Lake, NY (US); Sadanand Vinayak Despande, Clifton Park, NY (US); Atsushi Ogino, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/362,499

(22) Filed: Nov. 28, 2016

(51) Int. Cl.
*H01L 23/528* (2006.01)
*H01L 23/544* (2006.01)
*H01L 23/522* (2006.01)
*H01L 23/532* (2006.01)
*H01L 21/768* (2006.01)
*H01L 23/00* (2006.01)

(52) U.S. Cl.
CPC .... *H01L 23/5286* (2013.01); *H01L 21/76879* (2013.01); *H01L 23/5226* (2013.01); *H01L 23/53228* (2013.01); *H01L 23/544* (2013.01); *H01L 23/562* (2013.01); *H01L 2223/5446* (2013.01)

(58) Field of Classification Search
CPC ............. H01L 23/5286; H01L 23/5226; H01L 23/53228; H01L 23/544; H01L 23/562; H01L 2223/5446; H01L 21/76879
See application file for complete search history.

(56) References Cited

U.S. PATENT DOCUMENTS

| | | | | |
|---|---|---|---|---|
| 5,138,419 A | * | 8/1992 | Tatematsu | G11C 5/063 257/723 |
| 5,739,546 A | * | 4/1998 | Saitou | H01L 22/32 257/207 |
| 2005/0098893 A1 | * | 5/2005 | Tsutsue | H01L 23/564 257/758 |
| 2008/0230874 A1 | * | 9/2008 | Yamada | H01L 21/78 257/620 |
| 2010/0001379 A1 | * | 1/2010 | Lee | H01L 23/5286 257/621 |
| 2010/0252830 A1 | * | 10/2010 | Osajima | H01L 22/32 257/48 |
| 2013/0069206 A1 | * | 3/2013 | Yoshizawa | H01L 22/34 257/620 |

(Continued)

*Primary Examiner* — Nathan W Ha
(74) *Attorney, Agent, or Firm* — Wanye F. Reinke, Esq.; Heslin Rothenberg Farley & Mesiti P.C.

(57) ABSTRACT

A method includes providing a semiconductor substrate having horizontal and vertical scribe lines thereon defining semiconductor areas for printed circuits and/or semiconductor devices, and forming a metallic structure on the semiconductor substrate to serve as a bus bar for the printed circuits and/or semiconductor devices. A semiconductor structure is realized with the method, the semiconductor structure including a semiconductor substrate having horizontal and vertical scribe lines thereon defining semiconductor areas for printed circuits and/or semiconductor devices, a metallic structure on the semiconductor substrate serving as a bus bar for the printed circuits and/or semiconductor devices, and printed circuits and/or semiconductor devices in the semiconductor areas.

9 Claims, 12 Drawing Sheets

(56) References Cited

U.S. PATENT DOCUMENTS

| | | | |
|---|---|---|---|
| 2016/0020181 A1* | 1/2016 | Yu | H01L 23/585 257/737 |
| 2016/0111360 A1* | 4/2016 | Cho | H01L 21/784 257/774 |
| 2016/0218069 A1* | 7/2016 | Yoshizawa | H01L 22/34 |
| 2016/0336265 A1* | 11/2016 | Shiu | H01L 24/03 |

* cited by examiner

STRUCTURE AND METHOD OF CONDUCTIVE BUS BAR FOR RESISTIVE SEED SUBSTRATE PLATING

BACKGROUND OF THE INVENTION

Technical Field

The present invention generally relates to back-end-of-the-line (BEOL) metallization. More particularly, the present invention relates to substitute bus bar metallization structures at the BEOL to provide the function of a bus bar.

Background Information

CMOS scaling simultaneously provides both cost and performance benefit. The scaling for advanced node technology attributes increases the pattern density and hence surface area. Therefore, to fit the physical space and enable processes; scaling of process parameters (e.g., film thickness, layer thickness, etc.) are also required. In the case of BEOL copper metallization, a conductive seed is an essential part of and a pre-condition for the plating process. The electrical contact for the plating process is conducted through the edge of the wafer. However, the scaling for advanced node technology has caused a huge resistance delta between wafer edge and center as: pattern density driven effective length from the wafer edge to center increases; and scaling of the barrier seed on advance node causes reduction of effective copper seed thickness.

When plating onto resistive substrates, the potential drop across the wafer surface can cause non-uniformities in the current density distribution. This so-called "terminal effect" leads to a naturally higher deposition rate at the wafer edge compared to the center. As a consequence during plating on such a resistive seed, a terminal effect causes: non-uniform plating across the wafer which causes a plated copper thickness difference between the wafer center and edge, and eventually resulting in a planarization issue; and non-conformal and non-continuous copper seed due to the difference in local bias voltage which causes embedded voids, and eventually poor reliability and/or yield loss.

SUMMARY OF THE INVENTION

Thus, a need exists for alternatives or improvements to a conventional bus bar.

The shortcomings of the prior art are overcome and additional advantages are provided through the provision, in one aspect, of a method. The method comprises providing a semiconductor structure, the semiconductor structure comprising a semiconductor substrate having a plurality of horizontal and vertical scribe lines thereon defining a plurality of semiconductor areas for a plurality of semiconductors, at least some of the plurality of semiconductors being situated in at least some of the plurality of semiconductor areas, and forming a metallic structure over the semiconductor structure to serve as a bus bar for the plurality of semiconductors. Forming the metallic structure comprises forming a plurality of continuous trenches along opposite sides of the plurality of horizontal and vertical scribe lines, and metallizing the continuous trenches, resulting in metallized continuous trenches such that the metallized continuous trenches serve as the bus bar.

In accordance with another aspect, a semiconductor structure is provided. The semiconductor structure comprises a semiconductor substrate having a plurality of horizontal and vertical scribe lines thereon defining a plurality of semiconductor areas for a plurality of semiconductors, the plurality of semiconductors being situated over the semiconductor substrate and/or in the plurality of semiconductor areas, and a metallic structure over the plurality of semiconductors serving as a bus bar therefor.

In accordance with yet another aspect, a method is provided. The method comprises providing a starting semiconductor structure; performing FEOL (Front End Of the Line) fabrication for the starting semiconductor structure, resulting in a fabricated semiconductor structure, and forming a conductive structure at the BEOL (Back End Of the Line), the conductive structure serving as a bus bar for the fabricated semiconductor structure.

These, and other objects, features and advantages of this invention will become apparent from the following detailed description of the various aspects of the invention taken in conjunction with the accompanying drawings.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable.

For example, in some circumstances, an event or capacity can be expected, while in other circumstances the event or capacity cannot occur—this distinction is captured by the terms "may" and "may be."

As used herein, unless otherwise specified, the term "about" or "approximately" used with a value, such as measurement, size, etc., means a possible variation of plus or minus ten percent of the value.

As used herein, the term "semiconductors" refers to one or more semiconductor devices and/or one or more printed circuits.

Reference is made below to the drawings, which are not drawn to scale for ease of understanding, wherein the same reference numbers may be used throughout different figures to designate the same or similar components.

Figure 1:
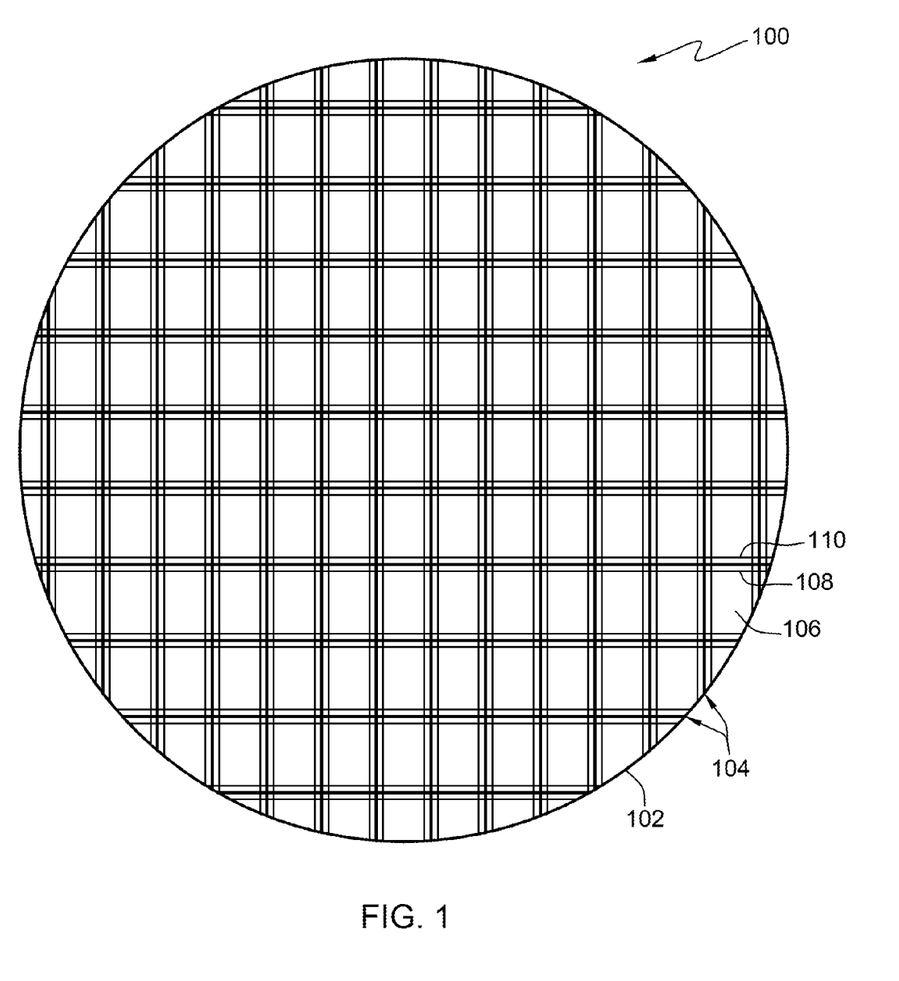
FIG. 1 is a top-down view of one example of a semiconductor structure, the semiconductor structure including a semiconductor substrate (in the example of FIG. 1, a semiconductor wafer) having scribe lines defining areas for semiconductors in which semiconductor device(s) may be formed and/or semiconductor circuit(s) may be printed, and trench lines on both sides of the scribe lines, in accordance with one or more aspects of the present invention.

FIG. 1 is a top-down view of one example of a semiconductor structure 100, the semiconductor structure including a semiconductor substrate 102 (in the example of FIG. 1, a semiconductor wafer) having scribe lines 104 defining areas for semiconductors (e.g., area 106 for a printed circuit) in which semiconductor device(s) may be formed and/or semiconductor circuit(s) may be printed, and trench lines on both sides of the scribe lines (e.g., trench lines 108 and 110), in accordance with one or more aspects of the present invention.

The semiconductor structure may be conventionally fabricated, for example, using known processes and techniques. However, it will be understood that there may be more or less areas for semiconductors on the substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
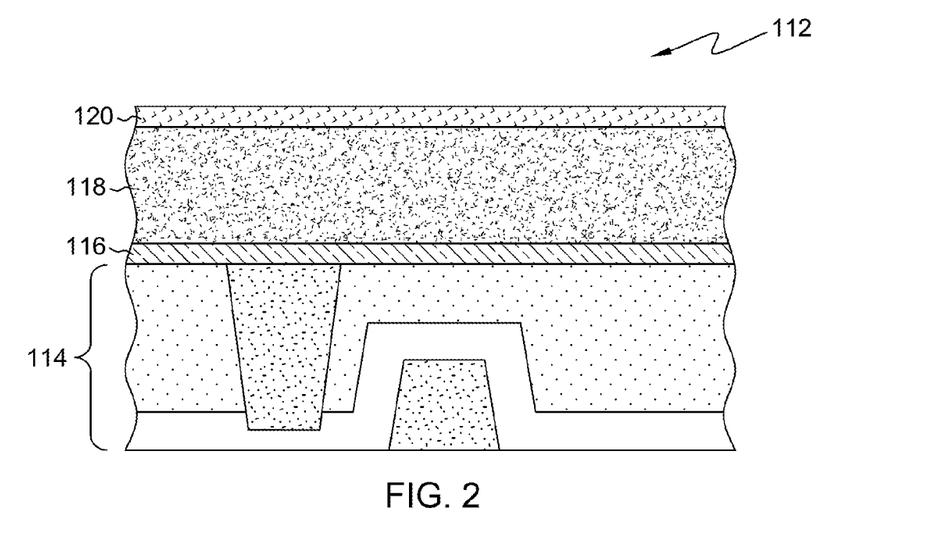
FIG. 2 is a cross-sectional view of one example of a starting semiconductor structure, the starting semiconductor structure including a semiconductor circuit, the specifics of which are not pertinent to the present invention, a hard mask layer thereover, a first dielectric layer over the hard mask layer, and a second dielectric layer over the first dielectric layer, in accordance with one or more aspects of the present invention.

FIG. 2 is a cross-sectional view of one example of a starting semiconductor structure 112, the starting semiconductor structure including a semiconductor device and/or circuit layer 114, the specifics of which are not pertinent to the present invention, a hard mask layer 116 thereover, for example, nitrite, carbon or silicon based materials (e.g., silicon nitride (SiN), silicon carbon (SiC), silicon carbonitride (SiCN), aluminum nitride (AlN), and the like), a bottom dielectric layer 118 over the hard mask layer, and a top dielectric layer 120 over the bottom dielectric layer, in accordance with one or more aspects of the present invention.

Each of the top and bottom dielectric layers may include any inorganic dielectric materials, organic dielectric materials, or combinations thereof. Suitable dielectric materials include, for example, carbon-doped silicon dioxide materials; fluorinated silicate glass (FSG); organic polymeric thermoset materials; silicon oxycarbide; carbon-doped oxide dielectrics including silicon, carbon, oxygen and hydrogen (SiCOH) dielectrics; fluorine-doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). For this particular embodiment, preferred dielectric materials include organic polymeric thermoset materials, consisting essentially of carbon, oxygen and hydrogen. Preferred dielectric materials include the low-k polyarylene ether polymeric material known as SiLK™ (available from The Dow Chemical Company), and the low-k polymeric material known as FLARE™ (available from Honeywell).

Dielectric materials may be porous, non-porous or contain regions and/or surfaces that are porous and other regions and/or surfaces that may be non-porous. Some examples of suitable dielectrics that can be used may include, but are not limited to, silicon oxide, silsesquioxanes, C doped oxides (i.e., organosilicates) that include atoms of Si, C, O and H, thermosetting polyarylene ethers, or multilayers thereof. The term "polyarylene" is used herein to denote aryl moieties or inertly substituted aryl moieties which are linked together by bonds, fused rings, or inert linking groups such as, for example, oxygen, sulfur, sulfone, sulfoxide, carbonyl and the like.

In some embodiments of the present invention, dielectric materials have a dielectric constant that is about 3.0 or less, with a dielectric constant of about 2.8 or less being even more typical. All dielectric constants mentioned herein are relative to a vacuum, unless otherwise noted. Dielectric materials that have dielectric constants of about 3.0 or less generally have a lower parasitic cross-talk as compared with dielectric materials that have a higher dielectric constant than 4.0. The thickness of the dielectric layers may vary depending upon the dielectric material used, as well as the exact number of dielectric layers within the interconnect structure of FIG. 2. In one embodiment, and by way of an example, the dielectric layers may have a thickness from about 20 nm to about 1000 nm.

Figure 3:
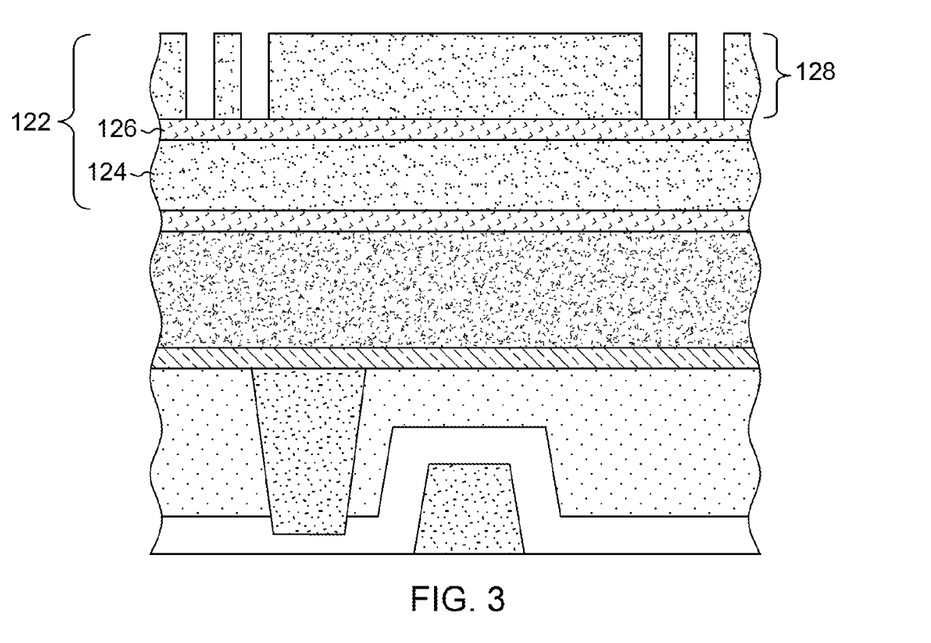
FIG. 3 depicts one example of the structure of FIG. 2 after forming a lithographic stack for patterning the first and second dielectric layers, respectively, the lithographic stack including, for example, an underlayer of a lithographic blocking material (e.g., photoresist) over the FIG. 1 structure, an anti-reflective layer (e.g., Si-ARC) over the underlayer, and a patterned layer of lithographic blocking material over the anti-reflective layer, in accordance with one or more aspects of the present invention.

FIG. 3 depicts one example of the structure of FIG. 2 after forming a lithographic stack 122 for patterning the bottom and top dielectric layers 118 and 120, respectively, the lithographic stack including, for example, an underlayer 124 of a lithographic blocking material (e.g., photoresist) over the FIG. 1 structure, an anti-reflective layer 126 (e.g., Si-ARC) over the underlayer, and a patterned layer 128 of lithographic blocking material (e.g., photoresist) over the anti-reflective layer, in accordance with one or more aspects of the present invention.

Figure 4:
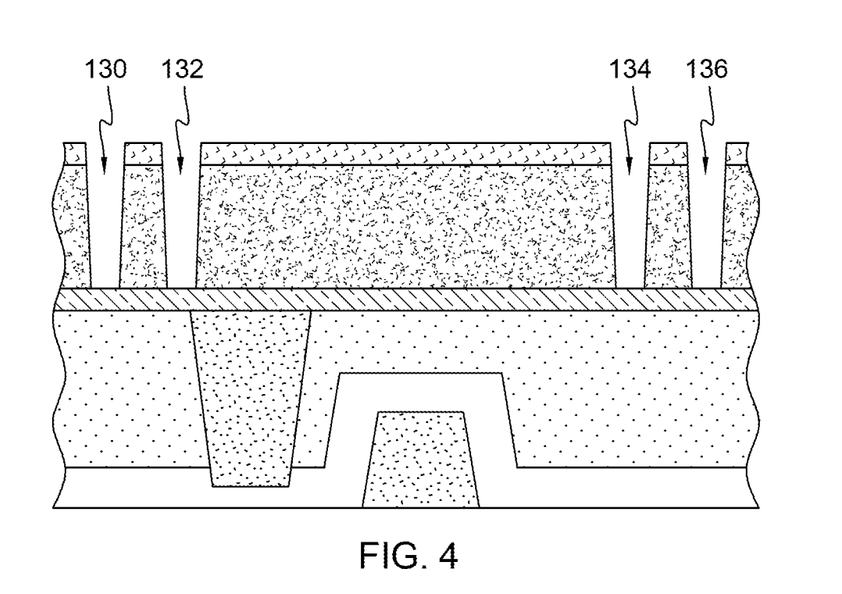
FIG. 4 depicts one example of the structure of FIG. 2 after forming openings and removing the lithographic stack, in accordance with one or more aspects of the present invention.

FIG. 4 depicts one example of the structure of FIG. 2 after forming openings 130, 132, 134 and 136 and removing the lithographic stack (122, FIG. 2), in accordance with one or more aspects of the present invention.

Figure 5:
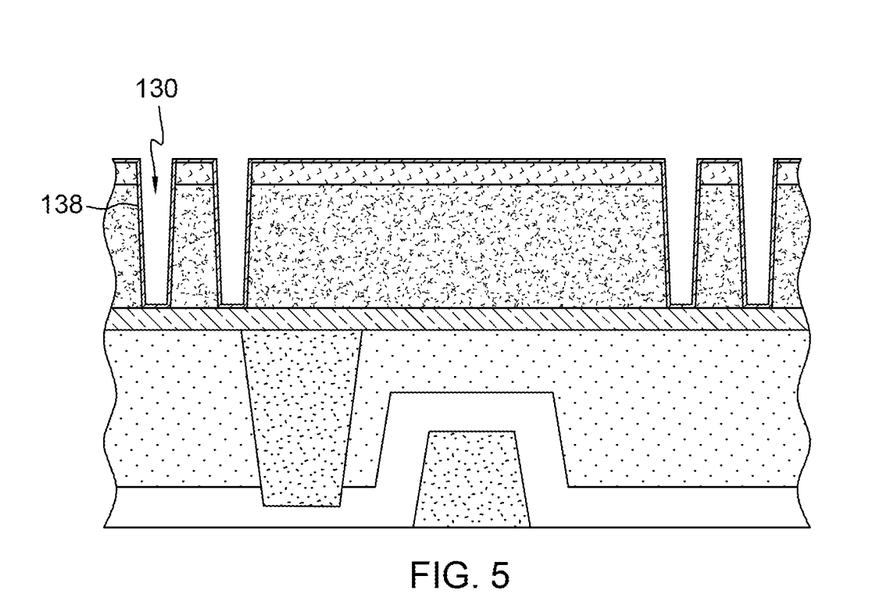
FIG. 5 depicts one example of the structure of FIG. 4 after forming a liner over the structure, in accordance with one or more aspects of the present invention.

FIG. 5 depicts one example of the structure of FIG. 4 after forming a liner 138 over the structure, in accordance with one or more aspects of the present invention.

In one example, the liner material includes tantalum nitride (TaN) and/or tantalum (Ta) may be used. In addition or alternatively to TaN and/or Ta, there may be multiple liner layers, one or more of other metals, for example, cobalt (Co), manganese (Mn), titanium (Ti), titanium nitride (TiN), tungsten (W), tungsten nitride (WN), tungsten silicide (WSi), ruthenium (Ru), ruthenium nitride (RuN), iridium (Ir), rhodium (Rh) and platinum (Pt), etc., or mixtures of thereof (e.g., alloys) may also be employed.

Figure 6:
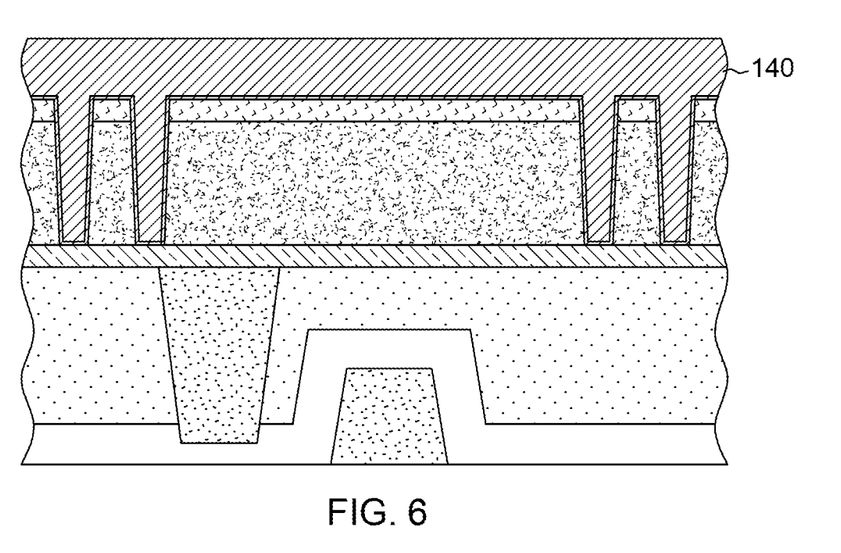
FIG. 6 depicts one example of the structure of FIG. 5 after over-filling the openings with a conductive material, in accordance with one or more aspects of the present invention.

FIG. 6 depicts one example of the structure of FIG. 5 after over-filling the openings with a conductive material 140, in accordance with one or more aspects of the present invention.

Figure 7:
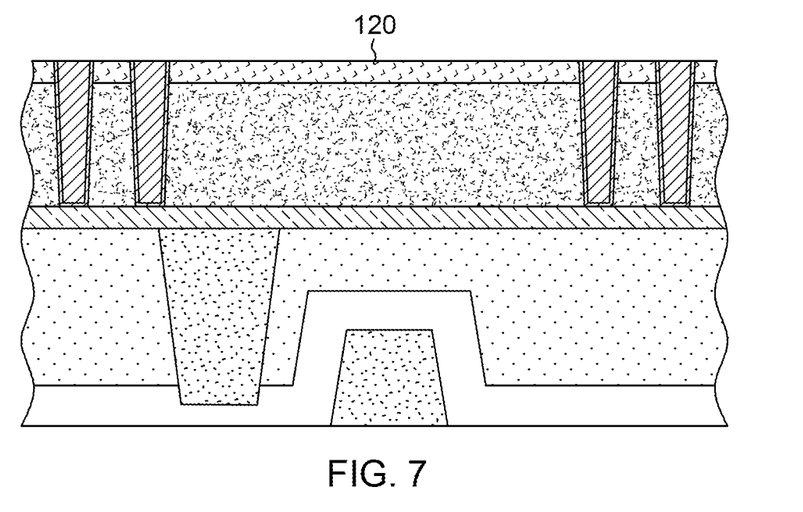
FIG. 7 depicts one example of the structure of FIG. 6 after planarizing the structure (e.g., chemical-mechanical polishing CM' process) down to the dielectric layer, in accordance with one or more aspects of the present invention.

FIG. 7 depicts one example of the structure of FIG. 6 after planarizing the structure (e.g., chemical-mechanical polishing CMP process) down to and stopping on dielectric layer 120, in accordance with one or more aspects of the present invention.

Figure 8:
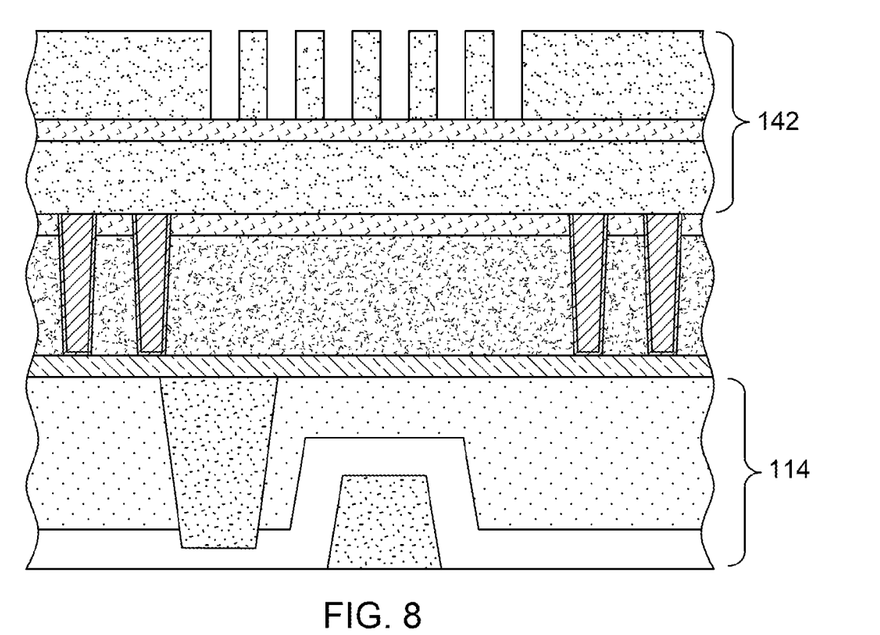
FIG. 8 depicts one example of the structure of FIG. 7 after forming another lithographic stack, similar to lithographic stack of FIG. 3, for patterning contacts to the semiconductor circuit, in accordance with one or more aspects of the present invention.

FIG. 8 depicts one example of the structure of FIG. 7 after forming another lithographic stack 142, similar to lithographic stack 122 of FIG. 3, for patterning contacts to the semiconductor device and/or circuit layer 114, in accordance with one or more aspects of the present invention.

Figure 9:
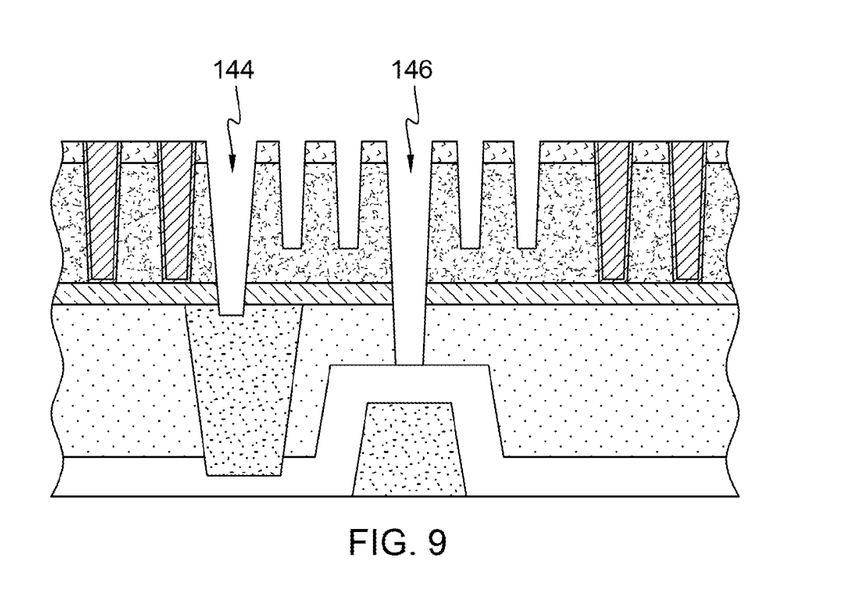
FIG. 9 depicts one example of the structure of FIG. 8 after forming openings and removing the lithographic stack, in accordance with one or more aspects of the present invention.

FIG. 9 depicts one example of the structure of FIG. 8 after forming openings (e.g., contact openings 144 and 146) and removing the lithographic stack (142, FIG. 8), in accordance with one or more aspects of the present invention.

Figure 10:
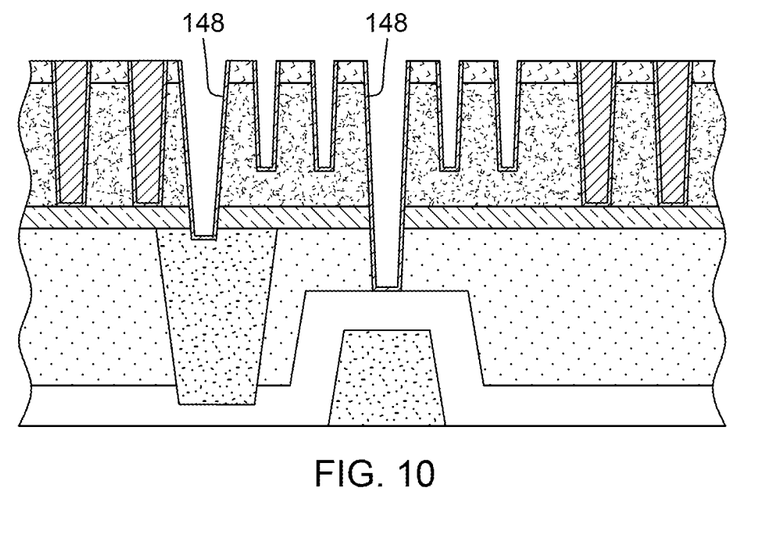
FIG. 10 depicts one example of the structure of FIG. 9 after lining the openings with liner material, in accordance with one or more aspects of the present invention.

FIG. 10 depicts one example of the structure of FIG. 9 after lining the openings (e.g., contact openings 144 and 146) with liner material 148, in accordance with one or more aspects of the present invention.

In one example, the liner material includes tantalum nitride (TaN) and/or tantalum (Ta) may be used. In addition or alternatively to TaN and/or Ta, there may be multiple liner layers, one or more of other metals, for example, cobalt (Co), manganese (Mn), titanium (Ti), titanium nitride (TiN), tungsten (W), tungsten nitride (WN), tungsten silicide (WSi), ruthenium (Ru), ruthenium nitride (RuN), iridium (Ir), rhodium (Rh) and platinum (Pt), etc., or mixtures of thereof (e.g., alloys) may also be employed.

Figure 11:
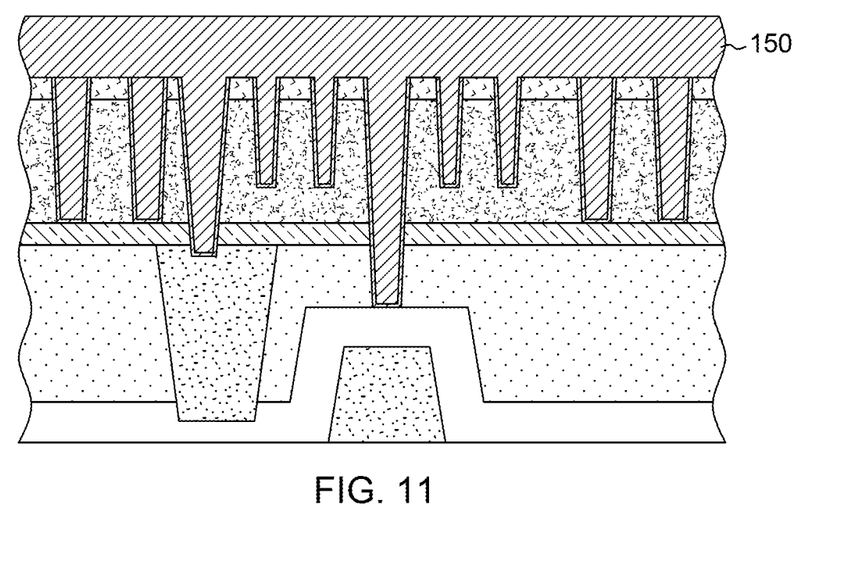
FIG. 11 depicts one example of the structure of FIG. 10 after over-filling the lined openings with a conductive material, in accordance with one or more aspects of the present invention.

FIG. 11 depicts one example of the structure of FIG. 10 after over-filling the lined openings with a conductive material 150, in accordance with one or more aspects of the present invention.

Figure 12:
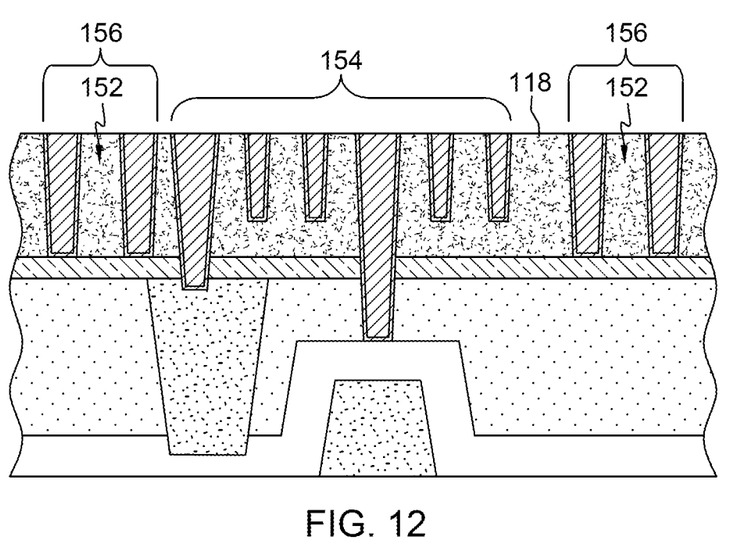
FIG. 12 depicts one example of the structure of FIG. 11 after planarizing the structure down to the first dielectric layer (i.e., stopping at the first dielectric layer), the planarized structure including back-end-of-the-line (BEOL) circuit wiring, scribe lines and metallic trenches on both sides of the scribe lines, the metallic trench lines being used as a metallic bus bar (e.g., copper), in accordance with one or more aspects of the present invention.

FIG. 12 depicts one example of the structure of FIG. 11 after planarizing the structure down to and stopping on the first dielectric layer 118, the planarized structure including back-end-of-the-line (BEOL) circuit wiring 154, scribe lines 152 and continuous trench lines 156 on both sides of the scribe lines, the continuous trench lines being used as a metallic bus bar (e.g., copper) when metallized, in accordance with one or more aspects of the present invention.

Figure 13:
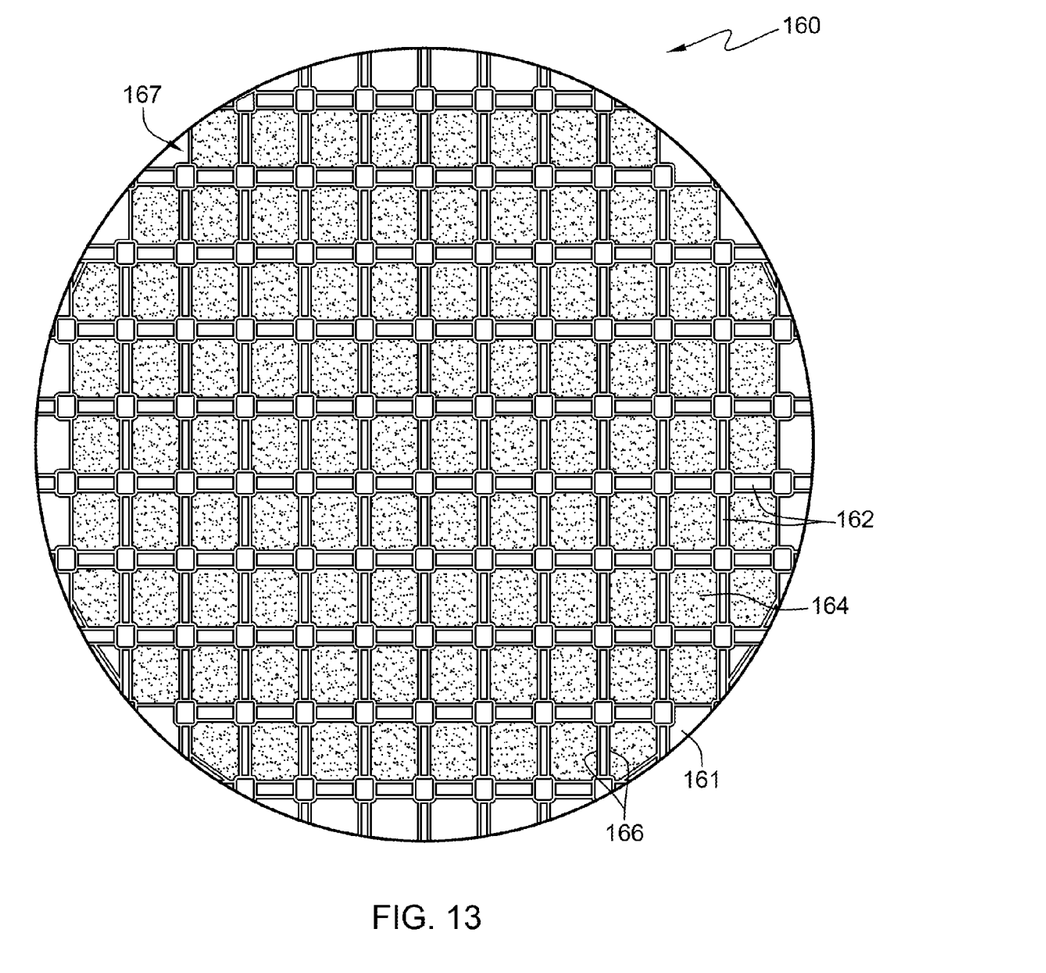
FIG. 13 is a top-down view of another example of a semiconductor structure, the semiconductor structure including a semiconductor substrate (e.g., semiconductor wafer), horizontal and vertical scribe lines defining circuit areas in which semiconductor circuits may be printed, metallic lines on either side of the scribe lines and continuous crack stops, in accordance with one or more aspects of the present invention.

FIG. 13 is a top-down view of another example of a semiconductor structure 160, the semiconductor structure including a semiconductor substrate 161 (e.g., semiconductor wafer), horizontal and vertical scribe lines (e.g., scribe lines 162) defining semiconductor device and/or circuit areas (e.g., semiconductor device and/or circuit area 164) in which semiconductor devices and/or circuits may be formed/printed, metallic lines (e.g., metallic lines 166) on either side of the scribe lines and continuous crack stops (e.g., crack stop 167), in accordance with one or more aspects of the present invention.

Figure 14:
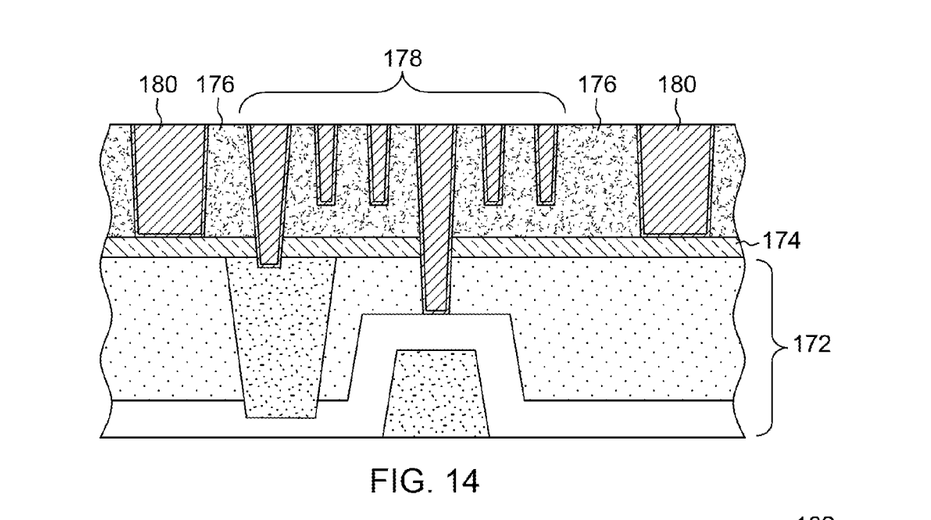
FIG. 14 is a cross-sectional view of another example of a semiconductor structure resulting from a fabrication process similar to that of FIGS. 2-12, the semiconductor structure including a circuit, a hard mask layer, scribe lines, BEOL circuit wiring for the semiconductor circuit, and crack stop/bus bar lines, in accordance with one or more aspects of the present invention.

FIG. 14 is a cross-sectional view of another example of a semiconductor structure 171 resulting from a fabrication process similar to that of FIGS. 2-12, the semiconductor structure including a semiconductor device and/or circuit layer 172, a hard mask layer 174, scribe lines 176, BEOL circuit wiring 178 for the semiconductor circuit, and crack stop/bus bar lines 180, in accordance with one or more aspects of the present invention.

In one example, the hard mask layer may include, for example, nitrite, carbon or silicon based materials (e.g., silicon nitride (SiN), silicon carbon (SiC), silicon carbonitride (SiCN), aluminum nitride (AlN), and the like.

Figure 15:
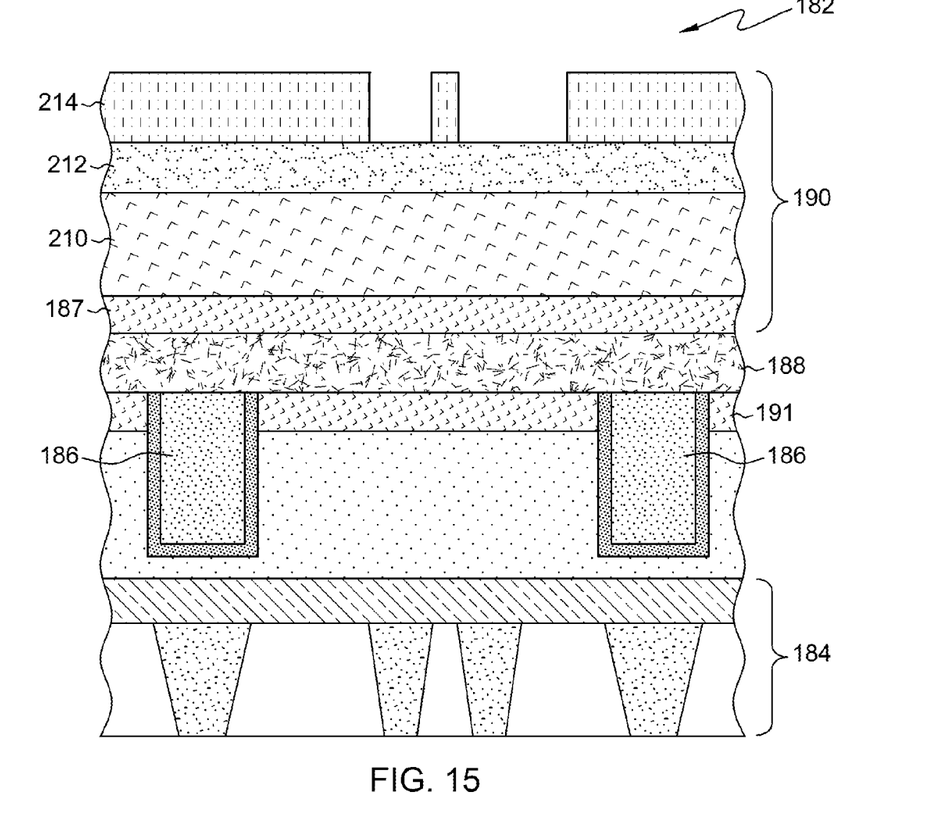
FIG. 15 is a cross sectional-view of another example of a starting semiconductor structure for a fabrication flow similar to that of FIGS. 2-12, the starting semiconductor structure including a circuit, scribe lines, a conductive layer situated between two dielectric layers (e.g., $SiO_2$), one layer being part of a lithographic stack also including an organic planarization layer (OPL) layer, a bottom anti-reflective coating (BARC) layer and a top photoresist layer, in accordance with one or more aspects of the present invention.

FIG. 15 is a cross sectional-view of another example of a starting semiconductor structure 182 for a fabrication flow similar to that of FIGS. 2-12, the starting semiconductor structure including a circuit 184, scribe lines 186, a conductive layer 188 situated between two dielectric layers 191 and 187, dielectric layer 187 being part of a lithographic stack 190 also including an organic planarization layer 210, a bottom anti-reflective coating (BARC) layer 212 and a top photoresist layer 214, in accordance with one or more aspects of the present invention.

Figure 16:
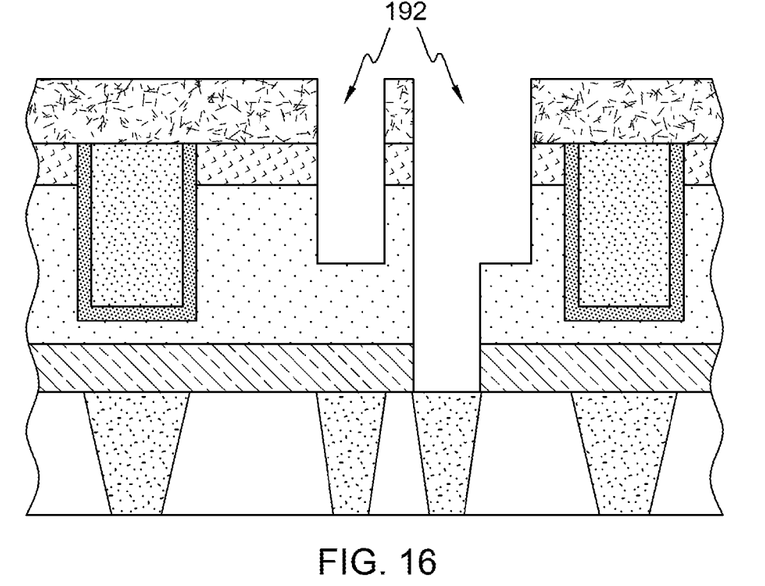
FIG. 16 depicts the starting semiconductor structure of FIG. 15 after performing lithography to create openings in the various layers, in accordance with one or more aspects of the present invention.

FIG. 16 depicts the starting semiconductor structure of FIG. 15 after performing lithography to create openings 192 in the various layers, in accordance with one or more aspects of the present invention.

Figure 17:
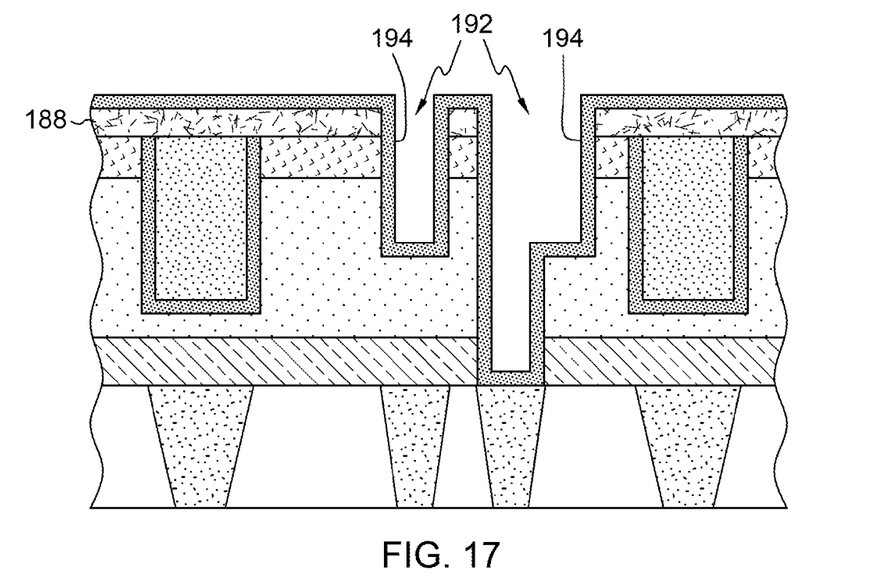
FIG. 17 depicts one example of the structure of FIG. 16 after lining the openings with a seed layer in preparation for conductive metal plating, in accordance with one or more aspects of the present invention.

FIG. 17 depicts one example of the structure of FIG. 16 after lining the openings 192 with a seed layer 194 in preparation for conductive metal plating, in accordance with one or more aspects of the present invention.

Figure 18:
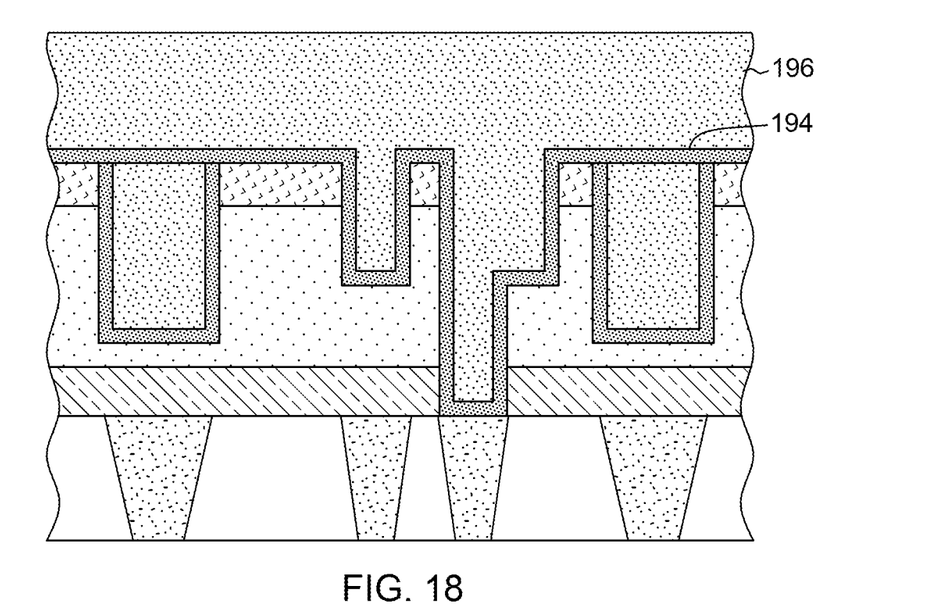
FIG. 18 depicts one example of the structure of FIG. 17 after bottom-up forming of the conductive metal plating (e.g., copper) using the seed layer, in accordance with one or more aspects of the present invention.

FIG. 18 depicts one example of the structure of FIG. 17 after bottom-up forming of the conductive metal plating 196 (e.g., copper) using seed layer 194, in accordance with one or more aspects of the present invention.

Figure 19:
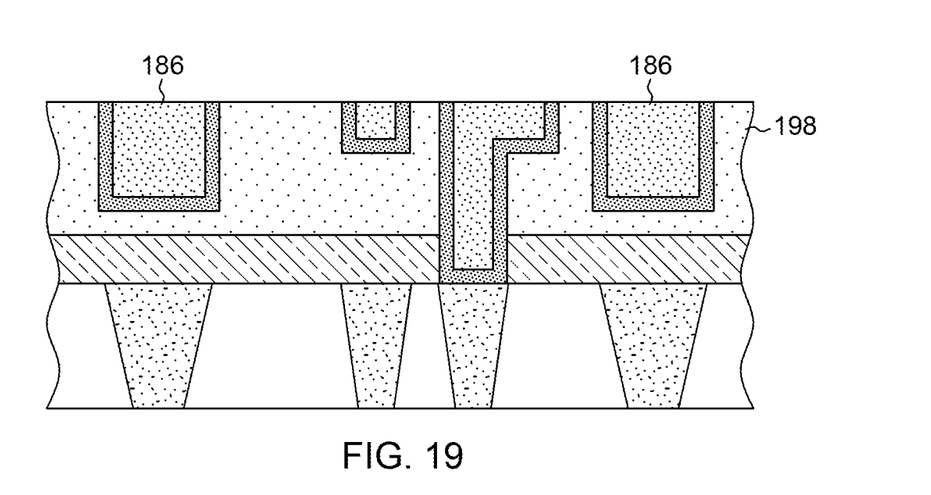
FIG. 19 depicts one example of the structure of FIG. 18 after planarizing down to dielectric layer (e.g., ILD), and forming the bus bar, in accordance with one or more aspects of the present invention.

FIG. 19 depicts one example of the structure of FIG. 18 after planarizing down to and stopping on dielectric layer 198 (e.g., ILD), forming bus bar 186, in accordance with one or more aspects of the present invention.

Figure 20:
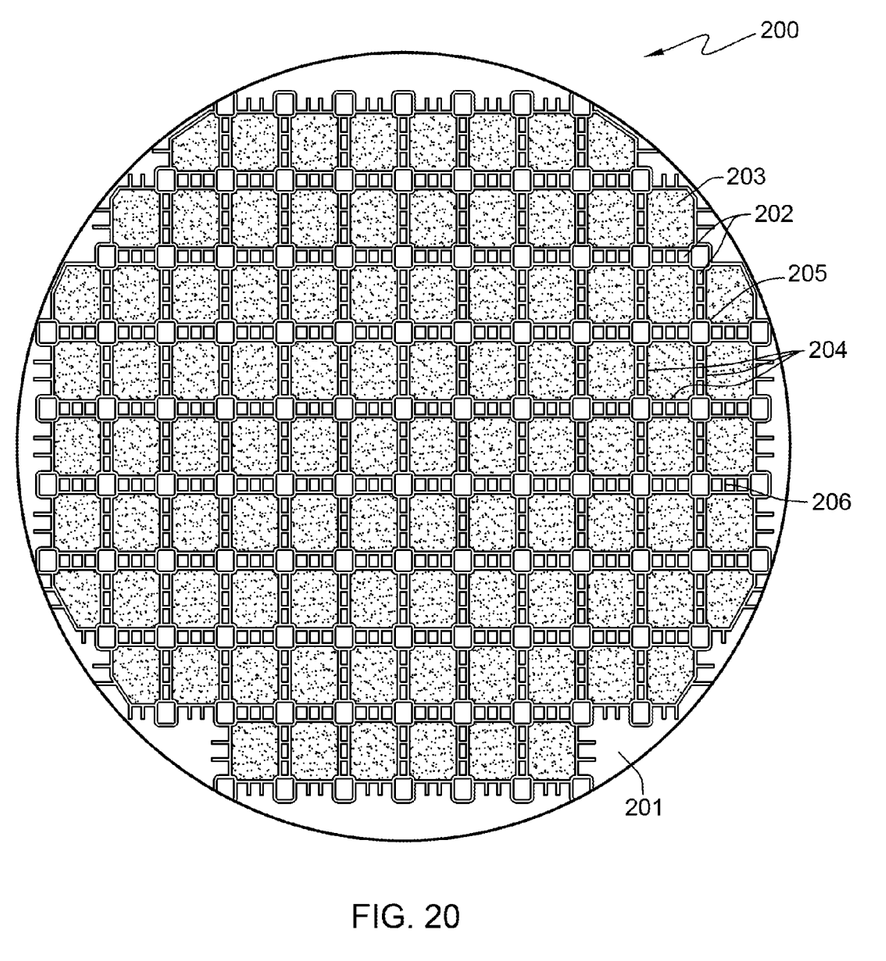
FIG. 20 is a top-down view of one example of a semiconductor structure combining the schemes of FIGS. 1 and 13, the semiconductor structure including a semiconductor substrate (here, a semiconductor wafer, e.g., silicon), horizontal and vertical scribe lines defining circuit areas in which semiconductor circuits may be printed, metallic trench lines on both sides of the scribe lines similar to FIG. 1, continuous crack stop lines similar to FIG. 13, and metallic connecting vias connecting adjacent metallic trench lines, in accordance with one or more aspects of the present invention.

FIG. 20 is a top-down view of one example of a semiconductor structure 200 combining the schemes of FIGS. 1 and 13, the semiconductor structure including a semiconductor substrate 201 (here, a semiconductor wafer, e.g., silicon), horizontal and vertical scribe lines (e.g., scribe lines 202) defining semiconductor device and/or circuit areas (e.g., semiconductor device and/or circuit area 203) in which semiconductor devices and/or circuits may be formed/printed, metallic trench lines (e.g., metallic trench lines 204) on both sides of the scribe lines similar to FIG. 1, continuous crack stop lines (e.g., crack stop line 205) similar to FIG. 13, and metallic connecting vias (e.g., metallic connecting via 206) connecting adjacent metallic trench lines, in accordance with one or more aspects of the present invention.

In a first aspect, disclosed above is a method. The method includes providing a semiconductor structure, the semiconductor structure including a semiconductor substrate having horizontal and vertical scribe lines thereon defining semiconductor areas for semiconductors, at least some of the semiconductors being situated in at least some of the semiconductor areas, and forming a metallic structure over the semiconductor structure to serve as a bus bar for the semiconductors.

In one example, forming the metallic structure may include, for example, forming continuous trenches along opposite sides of the horizontal and vertical scribe lines, and metallizing the continuous trenches, resulting in metallized continuous trenches such that the metallized continuous trenches serve as the bus bar. In one example, the method may further include, for example, after the metallizing, fabricating/printing any remainder of the semiconductors (i.e., fabricating any remaining semiconductor devices and printing any remaining semiconductor circuits). In one example, the fabricating/printing may include, for example, forming a protective layer over the metallized continuous trenches, patterning for the any remainder of the semiconductors, resulting in a pattern, removing the protective layer, and metallizing the pattern.

In one example, forming the metallic structure in the method of the first aspect may include, for example, forming crack stop trenches at corners of printed circuit(s) of the semiconductors, the crack stops being electrically connected together. In one example, forming the crack stops may be done, for example, after FEOL. In another example, the method may further include, for example, forming a protective layer over the crack stop trenches.

In one example, forming the metallic structure in the method of the first aspect may include, for example, forming continuous trenches along opposite sides of the horizontal and vertical scribe lines, metallizing the continuous trenches, resulting in metallized continuous trenches such that the metallized continuous trenches serve as the bus bar, forming crack stop trenches at corners of the semiconductor areas, and metallizing the crack stop trenches, resulting in metallized crack stop trenches such that the metallized crack stop trenches are electrically connected together. In one example, the method may further include, for example, after metallizing the continuous trenches and the crack stop trenches, fabricating/printing any remainder of the semiconductors. In one example, the fabricating/printing may include, for example, forming a protective layer over the metallized continuous trenches and the metallized crack stop trenches, patterning for the any remainder of the plurality of semiconductors, resulting in a pattern, removing the protective layer, and metallizing the pattern.

In a second aspect, disclosed above is a semiconductor structure. The semiconductor structure includes a semiconductor substrate having horizontal and vertical scribe lines thereon defining semiconductor areas for semiconductors, the semiconductors being situated over the semiconductor substrate and/or in the semiconductor areas, and a metallic structure over the semiconductors serving as a bus bar therefor.

In one example, the metallic structure may include, for example, metallized continuous trenches adjacent the horizontal and vertical scribe lines.

In one example, the metallic structure of the semiconductor structure of the second aspect may include, for example, electrically connected metallized crack stop trenches at corners of printed circuits of the semiconductors.

In one example, the metallic structure of the semiconductor structure of the second aspect may include, for example, metallized continuous trenches adjacent the horizontal and vertical scribe lines, and electrically connected metallized crack stop trenches at corners of printed circuits of the semiconductors.

In a third aspect, disclosed above is a method. The method includes providing a starting semiconductor structure; performing FEOL (Front End Of the Line) fabrication for the starting semiconductor structure, resulting in a fabricated semiconductor structure, and forming a conductive structure at the BEOL (Back End Of the Line), the conductive structure serving as a bus bar for the fabricated semiconductor structure.

The problem noted in the background is solved by the present invention using conductive metal (e.g., copper) added throughout using horizontal and vertical scribe lines as a template which will have an order of magnitude lower resistance than the metal seed being used for plating. In short, a lower resistance substitute metallic structure is used in place of a conventional bus bar via metal seeding and plating. A bus bar is a metallic conductor that conducts substantial current within a distribution board (in this case, the wafer surface). The invention includes fabrication and use of continuous crack stop trenches as a conductive bus bar or grid line, and/or fabrication of continuous trenches along the scribe line and utilization thereof as a conductive bus bar. As such, the resultant parallel resistance of a macro or an individual die on the wafer will be significantly lower than conventionally possible, and the difference in resistance from the center to edge will be negligible. Thus, a very uniform deposition can be conducted. This invention will help to overcome, for example:

Plating terminal effect;

Resultant non-uniform deposition due to the difference in copper deposition rate between center and edge;

Avoid CMP under-polish issue as well short yield degradation that mostly come due to the underpolish from the wafer edge due to thicker copper;

Minimize or avoid the embedded voids that caused due to copper dissolution from localized bias potential difference;

The two step cut and build of the crack stop will also help to over come the technical challenges of printing and metallization of thin wire circuits and large dimension crack stop in a single step; and Metallic trench lines (e.g., copper) on both sides of the scribe line will separate individual dies from one another. In addition to its utilization as a conductive bus bar, these lines will also act as a primary crack propagation barrier/crack stop during dicing.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a semiconductor structure, the semiconductor structure comprising a semiconductor substrate having a plurality of horizontal and vertical scribe lines thereon defining a plurality of semiconductor areas for a plurality of semiconductors, at least some of the plurality of semiconductors being situated in at least some of the plurality of semiconductor areas; and
   forming a metallic structure over the semiconductor structure to serve as a bus bar for the plurality of semiconductors, wherein forming the metallic structure comprises:
      forming a plurality of continuous trenches along opposite sides of the plurality of horizontal and vertical scribe lines; and
      metallizing the continuous trenches, resulting in metallized continuous trenches such that the metallized continuous trenches serve as the bus bar.

2. The method of claim 1, further comprising, after the metallizing, fabricating/printing any remainder of the plurality of semiconductors.

3. The method of claim 2, wherein the fabricating/printing comprises:
   forming a protective layer over the metallized continuous trenches;
   patterning for the any remainder of the plurality of semiconductors, resulting in a pattern;
   removing the protective layer; and
   metallizing the pattern.

4. A method, comprising:
   providing a semiconductor structure, the semiconductor structure comprising a semiconductor substrate having a plurality of horizontal and vertical scribe lines thereon defining a plurality of semiconductor areas for a plurality of semiconductors, at least some of the plurality of semiconductors being situated in at least some of the plurality of semiconductor areas; and
   forming a metallic structure over the semiconductor structure to serve as a bus bar for the plurality of semiconductors;
   wherein forming the metallic structure comprises forming a plurality of crack stop trenches at corners of one or more printed circuits of the plurality of semiconductors, the plurality of crack stops being electrically connected together.

5. The method of claim 4, wherein forming the plurality of crack stops is done after FEOL.

6. The method of claim 4, further comprising forming a protective layer over the plurality of crack stop trenches.

7. A method, comprising:
   providing a semiconductor structure, the semiconductor structure comprising a semiconductor substrate having a plurality of horizontal and vertical scribe lines thereon defining a plurality of semiconductor areas for a plurality of semiconductors, at least some of the plurality of semiconductors being situated in at least some of the plurality of semiconductor areas; and
   forming a metallic structure over the semiconductor structure to serve as a bus bar for the plurality of semiconductors, wherein forming the metallic structure comprises:
   forming a plurality of continuous trenches along opposite sides of the plurality of horizontal and vertical scribe lines;
   metallizing the plurality of continuous trenches, resulting in metallized continuous trenches such that the metallized continuous trenches serve as the bus bar;
   forming a plurality of crack stop trenches at corners of the plurality of semiconductor areas; and
   metallizing the plurality of crack stop trenches, resulting in metallized crack stop trenches such that the metallized crack stop trenches are electrically connected together.

8. The method of claim 7, further comprising, after metallizing the plurality of continuous trenches and the plurality of crack stop trenches, fabricating/printing any remainder of the plurality of semiconductors.

9. The method of claim 8, wherein the fabricating/printing comprises:
   forming a protective layer over the metallized continuous trenches and the metallized crack stop trenches;
   patterning for the any remainder of the plurality of semiconductors, resulting in a pattern;
   removing the protective layer; and
   metallizing the pattern.

* * * * *